(12) United States Patent
Park

(10) Patent No.: US 7,564,135 B2
(45) Date of Patent: Jul. 21, 2009

(54) SEMICONDUCTOR DEVICE HAVING SELF-ALIGNED CONTACT AND METHOD OF FABRICATING THE SAME

(75) Inventor: Won-Mo Park, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 71 days.

(21) Appl. No.: 11/420,203

(22) Filed: May 24, 2006

(65) Prior Publication Data

US 2007/0170486 A1 Jul. 26, 2007

(30) Foreign Application Priority Data

Jan. 23, 2006 (KR) ................. 10-2006-0006994

(51) Int. Cl.
*H01L 23/528* (2006.01)

(52) U.S. Cl. ............... 257/758; 257/774; 257/E23.145

(58) Field of Classification Search ............... 257/758
See application file for complete search history.

(56) References Cited

U.S. PATENT DOCUMENTS

| | | | | |
|---|---|---|---|---|
| 5,442,236 A | * | 8/1995 | Fukazawa | 257/758 |
| 5,759,914 A | | 6/1998 | Park | |
| 6,022,804 A | * | 2/2000 | Yano et al. | 438/675 |
| 6,245,664 B1 | * | 6/2001 | Miyai | 438/622 |
| 6,313,029 B1 | | 11/2001 | Kim | |
| 6,710,466 B2 | * | 3/2004 | Park | 257/758 |
| 2003/0015796 A1 | * | 1/2003 | Hasunuma | 257/758 |
| 2005/0082586 A1 | * | 4/2005 | Tu et al. | 257/296 |

FOREIGN PATENT DOCUMENTS

JP 10-340953 12/1998

OTHER PUBLICATIONS

English language abstract of Japanese Publication No. 10-340953.

\* cited by examiner

*Primary Examiner*—Minh-Loan T Tran
*Assistant Examiner*—W. Wendy Kuo
(74) *Attorney, Agent, or Firm*—Marger Johnson & McCollom, P.C.

(57) ABSTRACT

A semiconductor device includes a conductive pattern disposed on a substrate, a first interlayer dielectric layer disposed on the substrate and the conductive pattern, a first dummy pattern disposed on the first interlayer dielectric layer and partially overlapping the conductive pattern, a second interlayer dielectric layer disposed on the first interlayer dielectric layer and the first dummy pattern, a second dummy pattern disposed on the second interlayer dielectric layer and partially overlapping the conductive pattern, a third interlayer dielectric layer disposed on the second interlayer dielectric layer and the second dummy pattern, and a contact plug that penetrates the third interlayer dielectric layer, the second interlayer dielectric layer, and the first interlayer dielectric layer to contact the conductive pattern, the contact plug arranged between the first dummy pattern and the second dummy pattern, the contact plug abutting the first dummy pattern and the second dummy pattern.

14 Claims, 12 Drawing Sheets

SEMICONDUCTOR DEVICE HAVING SELF-ALIGNED CONTACT AND METHOD OF FABRICATING THE SAME

CROSS-REFERENCE TO RELATED APPLICATIONS

This application claims priority from Korean Patent Application No. 10-2006-0006994, which was filed on 23 Jan. 2006. Korean Patent Application No. 10-2006-006994 is incorporated by reference in its entirety.

BACKGROUND

1. Technical Field

This disclosure relates to a semiconductor device and a method of fabricating the same, and more particularly, to a semiconductor device having a self-aligned contact and a method of fabricating the same.

2. Description of the Related Art

A semiconductor device, such as a dynamic random access memory (DRAM), may include transistors, capacitors, load resistors, and interconnections. The interconnections include a contact plug that electrically connects conductive patterns. As semiconductor devices become highly integrated, the two-dimensional sizes of components are reduced and a plurality of layers may be required. Thus, the aspect ratio of the contact plug increases, and an alignment margin in a patterning process decreases, making it increasingly difficult to form the contact plug having a fine size in a desired position.

FIG. 1 is a cross-sectional diagram illustrating a method for forming a contact of a conventional semiconductor device.

Referring to FIG. 1, an isolation layer 13 is formed in a predetermined region of a semiconductor substrate 11. A lower conductive pattern 15 may be formed on the semiconductor substrate 11 having the isolation layer 13. A first interlayer dielectric layer 17 may be formed on the semiconductor substrate 11 having the lower conductive pattern 15. An upper conductive pattern 19 may be formed on the first interlayer dielectric layer 17. The upper conductive pattern 19 may partially overlap the lower conductive pattern 15. A second interlayer dielectric layer 21 and a third interlayer dielectric layer 23 may be sequentially formed on the semiconductor substrate 11 having the upper conductive pattern 19.

Thereafter, a first contact hole 26 and a second contact hole 27 are formed through the first, second, and third interlayer dielectric layers 17, 21, and 23 using a patterning process. The patterning process includes forming a mask pattern (not shown), such as a photoresist pattern, on the third interlayer dielectric layer 23 and sequentially and anisotropically etching the first, second, and third interlayer dielectric layers 17, 21, and 23 using the mask pattern as an etch mask. The first contact hole 26 sequentially penetrates the third and second interlayer dielectric layers 23 and 21 and partially exposes the upper conductive pattern 19. Also, the second contact hole 27 sequentially penetrates the third, second, and first interlayer dielectric layers 23, 21, and 17 and partially exposes the semiconductor substrate 11.

When the first interlayer dielectric layer 17 is anisotropically etched to form the second contact hole 27, the upper conductive pattern 19 functions as an etch stop layer. However, the patterning process has an alignment error. In other words, the alignment error causes the first and second contact holes 26 and 27 to be misaligned by an amount indicated by the arrow labeled "M." In this case, the first contact hole 26 may deviate from the upper conductive pattern 19. Thus, while anisotropically etching the first interlayer dielectric layer 17 to form the second contact hole 27, an extended hole 26M may be formed at one side of the upper conductive pattern 19. The extended hole 26M exposes a sidewall of the upper conductive pattern 19 and also, partially exposes the lower conductive pattern 15 through the first interlayer dielectric layer 17.

Thereafter, a conductive layer (not shown) may be formed to fill the first and second contact holes 26 and 27. Here, the upper conductive pattern 19 should be electrically insulated from the lower conductive pattern 15 by the first interlayer dielectric layer 17. However, since the extended hole 26M is also filled with the conductive layer, the upper conductive pattern 19 is electrically connected to the lower conductive pattern 15 by the conductive layer. As a result, the extended hole 26M causes a contact failure.

Another method for forming interconnections of a semiconductor device is disclosed by U.S. Pat. No. 6,313,029 B1 to Kim entitled "Method for Forming Multi-layer Interconnection of a Semiconductor Device." According to Kim, a method for forming a fine contact hole using a typical masking process is provided.

Embodiments of the invention address the above and other disadvantages of the conventional art.

SUMMARY

An embodiment of the invention provides a semiconductor device capable of preventing a contact failure.

Another embodiment of the invention provides a method of fabricating a semiconductor device capable of preventing a contact failure.

BRIEF DESCRIPTION OF THE DRAWINGS

The foregoing and other objects, features, and advantages of the invention will be apparent from the more particular description of exemplary embodiments of the invention, as illustrated in the accompanying drawings. The drawings are not necessarily to scale, emphasis instead being placed upon illustrating the principles of the invention.

DETAILED DESCRIPTION

Figure 1:
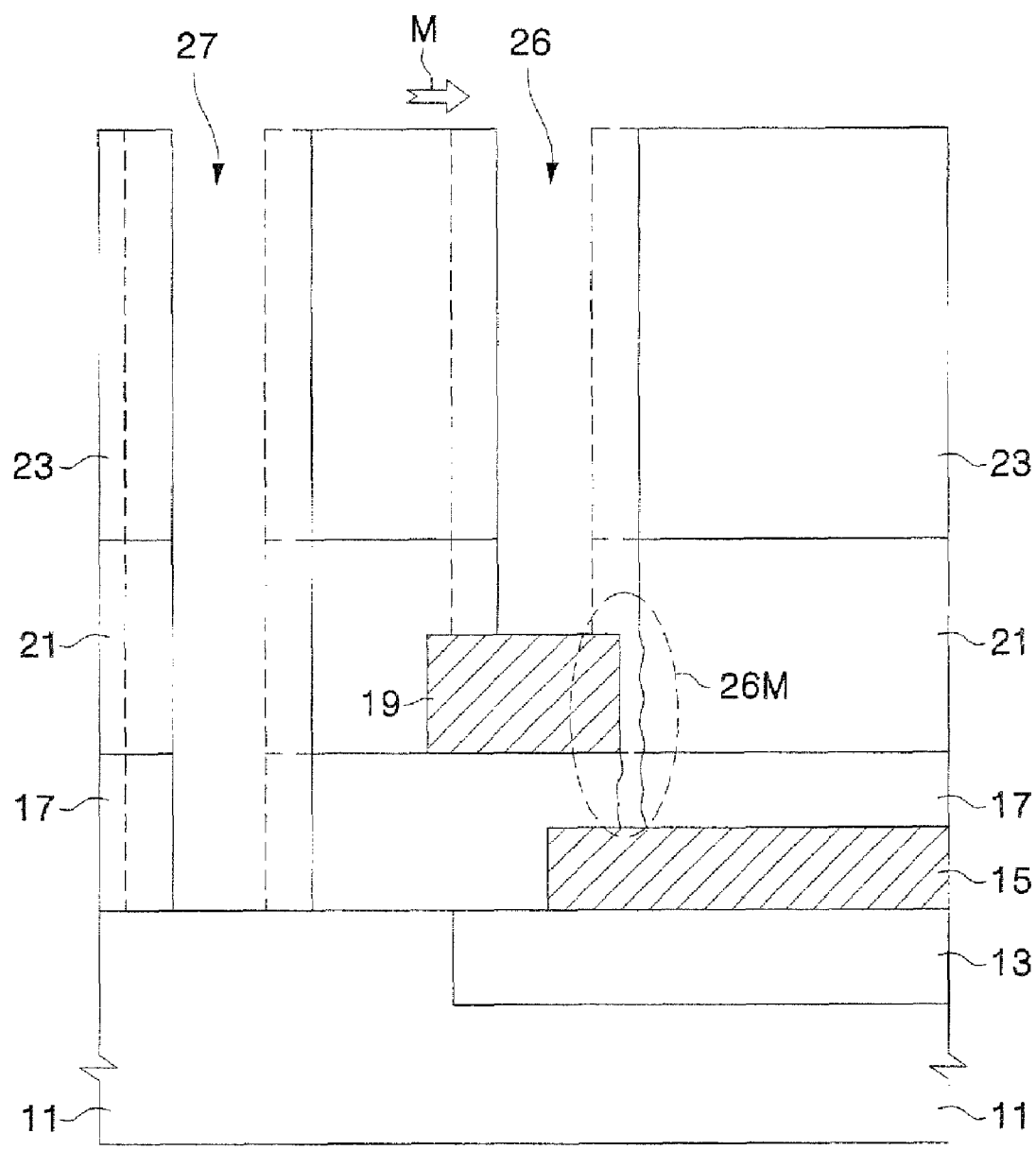
FIG. 1 is a cross-sectional diagram illustrating a method for forming a contact of a conventional semiconductor device.

The invention will now be described more fully hereinafter with reference to the accompanying drawings, in which exemplary embodiments of the invention are shown. This invention may, however, be embodied in different forms and should not be construed as limited to the exemplary embodiments set forth herein. Rather, these exemplary embodiments are provided so that this disclosure will be thorough and complete, and will fully convey the scope of the invention to those skilled in the art. In the drawings, the thickness of layers and regions are exaggerated for clarity. Like numbers refer to like elements throughout the specification.

Figure 2:
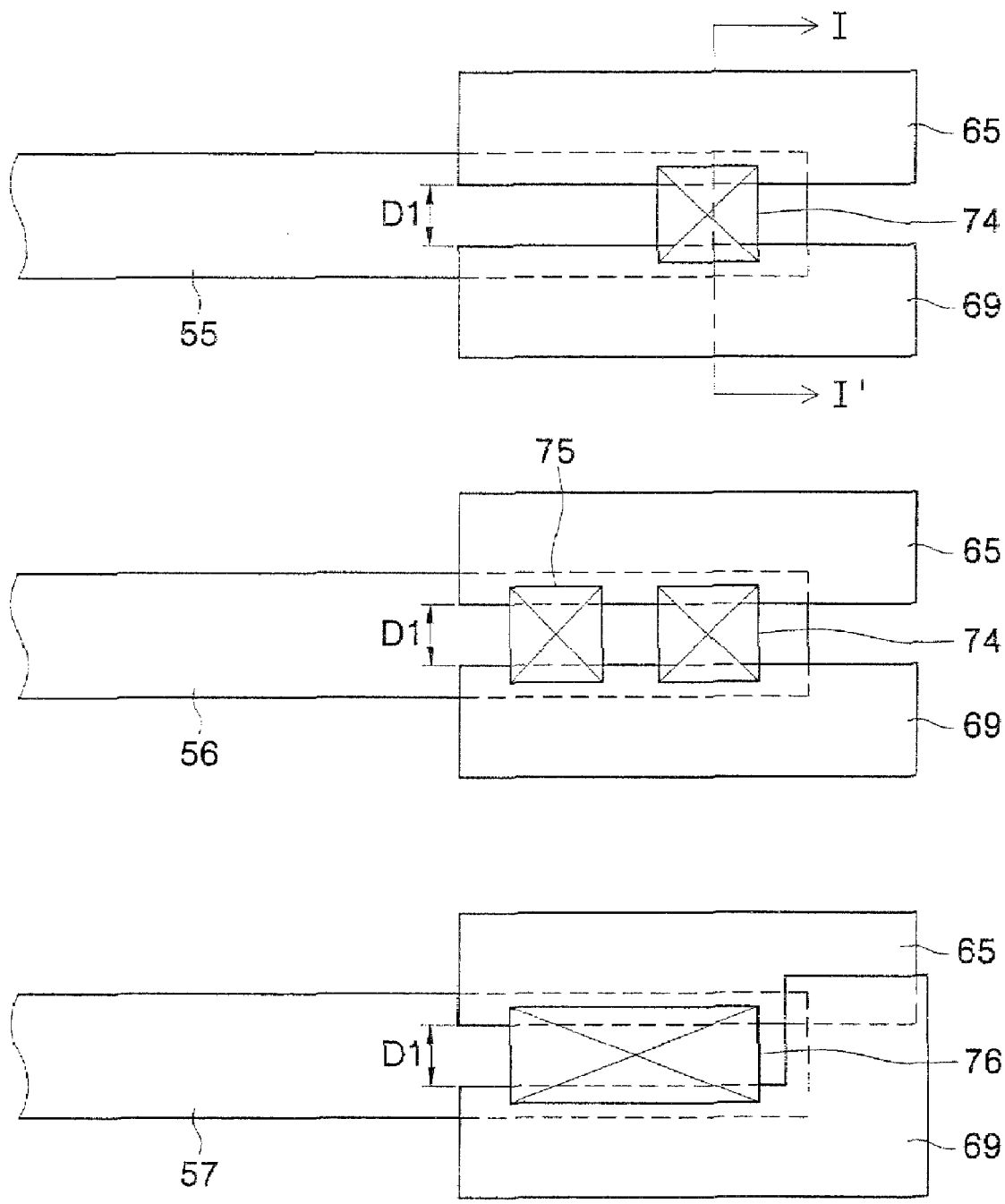
FIG. 2 is a plan diagram illustrating a portion of a semiconductor device having a self-aligned contact according to some embodiments of the invention.

FIG. 2 is a plan diagram illustrating a portion of a semiconductor device having a self-aligned contact according to some embodiments of the invention, while FIGS. 3 through 8 are cross-sectional diagrams taken along line I-I' of FIG. 2, illustrating a method of fabricating the semiconductor device of FIG. 2 according to some embodiments of the invention. FIGS. 9 through 13 are cross-sectional diagrams illustrating a method of fabricating a dynamic random access memory (DRAM) device having a self-aligned contact according to some other embodiments of the invention.

Figure 8:
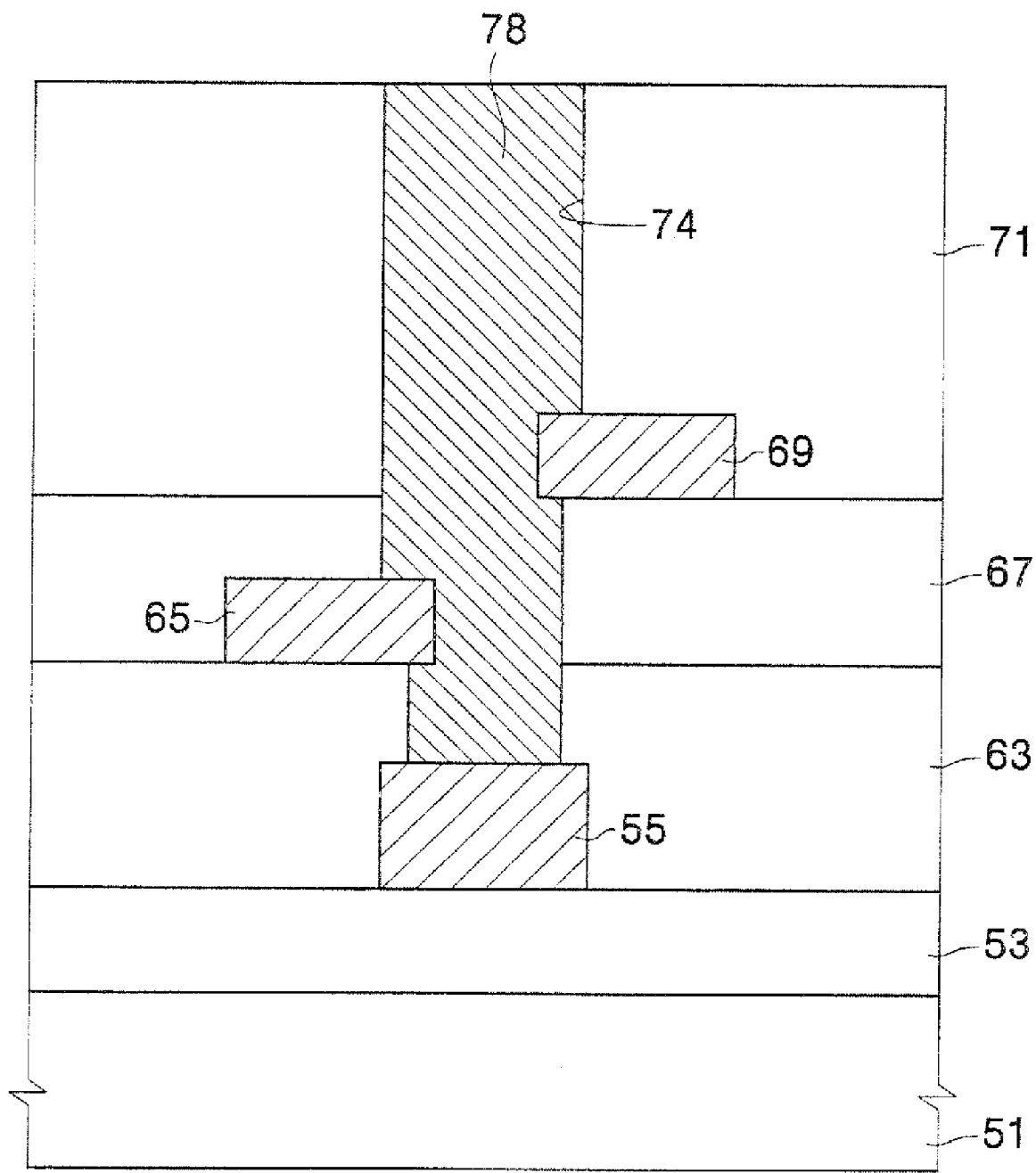

A semiconductor device having a self-aligned contact according to some embodiments of the invention will now be described with reference to FIGS. 2 and 8. Referring to FIGS. 2 and 8, the semiconductor device includes conductive patterns 55, 56, and 57, which are disposed on a substrate 51.

The substrate 51 may be a semiconductor substrate, such as a silicon wafer or a silicon on insulator (SOI) wafer. Normally, some components such as an isolation layer and an access transistor may be disposed on the substrate 51, but a detailed description thereof will not be presented here for brevity of explanation. A lower interlayer dielectric layer 53 may be disposed on the substrate 51. The lower interlayer dielectric layer 53 may be a silicon oxide layer, a silicon nitride layer, or a combination thereof. The lower interlayer dielectric layer 53 may cover the substrate 51. The conductive patterns 55, 56, and 57 may be a first conductive pattern 55, a second conductive pattern 56, and a third conductive pattern 57, which are spaced apart from one another. The conductive patterns 55, 56, and 57 may be disposed on the lower interlayer dielectric layer 53. The conductive patterns 55, 56, and 57 may be formed of a polysilicon layer, a tungsten (W) layer, or a metal silicide layer.

Alternatively, the conductive patterns 55, 56, and 57 may be disposed in the substrate 51. In this case, the conductive patterns 55, 56, and 57 may be impurity-doped active regions. Also, the lower interlayer dielectric layer 53 may be omitted.

The substrate 51 having the conductive patterns 55, 56, and 57 may be covered with a first interlayer dielectric layer 63. The first interlayer dielectric layer 63 may be a high-density plasma (HDP) oxide layer, a boron phosphorus silicate glass (BPSG) layer, a PE-TEOS layer, a silicon nitride layer, a silicon oxynitride layer, or a combination of two or more of the aforementioned layers.

First dummy patterns 65 are disposed on the first interlayer dielectric layer 63. The first dummy patterns 63 may partially overlap the conductive patterns 55, 56, and 57. That is, the first dummy pattern 65 may partially overlap the first conductive pattern 55. Also, the first dummy pattern 65 may partially overlap the second conductive pattern 56. Likewise, the first dummy pattern 65 may partially overlap the third conductive pattern 57. The first dummy patterns 65 may have a bar shape, an L shape, or a C shape. The first dummy patterns 65 may be formed of a material having an etch selectivity with respect to the first interlayer dielectric layer 63. The first dummy patterns 65 may be formed of a material selected from the group consisting of polysilicon, tungsten (W), aluminum (Al), and copper (Cu).

The substrate 51 having the first dummy patterns 65 is covered with a second interlayer dielectric layer 67. The second interlayer dielectric layer 67 may be an HDP oxide layer, a BPSG layer, a PE-TEOS layer, a silicon nitride layer, a silicon oxynitride layer, or a combination of two or more of the aforementioned layers.

Second dummy patterns 69 are disposed on the second interlayer dielectric layer 67. The second dummy patterns 69 may be spaced apart from the first dummy patterns 65 and partially overlap the conductive patterns 55, 56, and 57. That is, the second dummy pattern 69 may partially overlap the first conductive pattern 55. Also, the second dummy pattern 69 may partially overlap the second conductive pattern 56. Likewise, the second dummy pattern 69 may partially overlap the third conductive pattern 57. The second dummy patterns 69 may have a bar shape, an L shape, or a C shape. The second dummy patterns 69 may be formed of a material having an etch selectivity with respect to the first and second interlayer dielectric layers 63 and 67. The second dummy patterns 69 may be formed of one material selected from the group consisting of polysilicon, tungsten (W), aluminum (Al), and copper (Cu).

The substrate 51 having the second dummy patterns 69 is covered with a third interlayer dielectric layer 71. The third interlayer dielectric layer 71 may be an HDP oxide layer, a BPSG layer, a PE-TEOS layer, a silicon nitride layer, a silicon oxynitride layer, or a combination of two or more of the aforementioned layers.

A first contact hole 74 is disposed through the third, second, and first interlayer dielectric layers 71, 67, and 63 to expose the first conductive pattern 55. Also, the first contact hole 74 and a second contact hole 75 adjacent to the first contact hole 74 may be disposed on the second conductive pattern 56. Further, a third contact hole 76 may be disposed on the third conductive pattern 57. When viewed from a plan view, each of the first, second, and third contact holes 74, 75, and 76 may have a square shape, a rectangular shape, a circular shape, or an elliptical shape. The first, second, and third contact holes 74, 75, and 76 may be disposed between the first dummy patterns 65 and the second dummy patterns 69 which face each other. That is, the first, second, and third contact holes 74, 75, and 76 may be self-aligned on the conductive patterns 55, 56, and 57 due to the first dummy patterns 65 and the second dummy patterns 69. When viewed from a plan view, a distance D1 between the first dummy pattern 65 and the second dummy pattern 69 may be less than the resolution limit of a photolithography process.

Contact plugs 78 may be disposed in the first, second, and third contact holes 74, 75, and 76. The contact plugs 78 may be disposed through the third, second, and first interlayer dielectric layers 71, 67, and 63 and come into contact with the first, second, and third conductive patterns 55, 56, and 57. Also, the contact plugs 78 may be disposed between the first dummy patterns 65 and the second dummy patterns 69, which face each other. That is, the contact plugs 78 may be self-aligned on the conductive patterns 55, 56, and 57 due to the first dummy patterns 65 and the second dummy patterns 69. Contact surfaces between the contact plugs 78 and the conductive patterns 55, 56, and 57 may have a square shape, a rectangular shape, a circular shape, or an elliptical shape.

The first and second dummy patterns 65 and 69 may be formed of a material having an etch selectivity with respect to the third, second, and first interlayer dielectric layers 71, 67, and 63. The second dummy patterns 69 may be disposed above the first dummy patterns 65.

Figure 13:
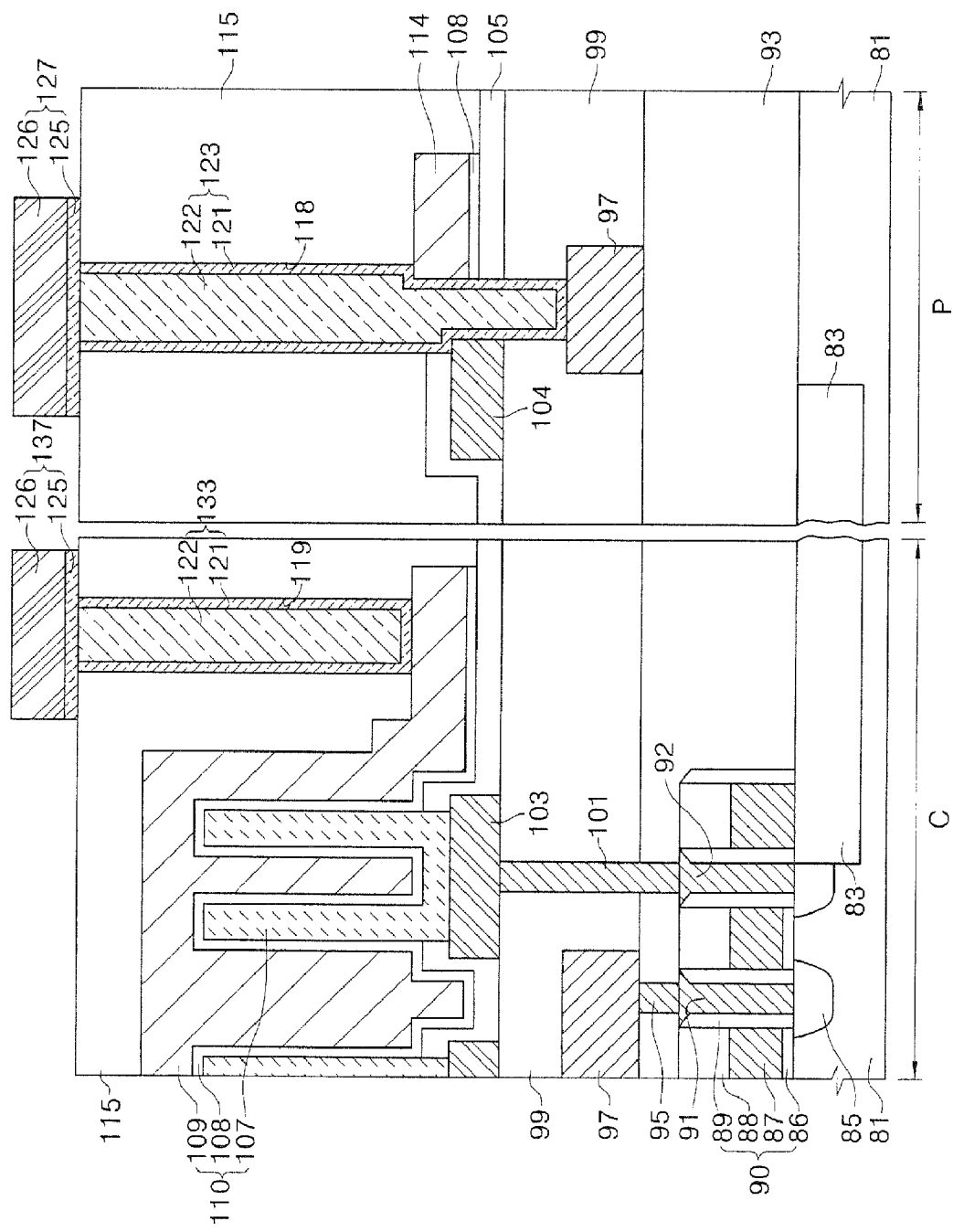

Referring to FIG. 13, a DRAM having a self-aligned contact according to some other embodiments of the invention is described below.

The DRAM includes bit lines 97 disposed on a substrate 81. The substrate 81 may be a semiconductor substrate, such as a silicon wafer or an SOI wafer, The substrate 81 may include a cell region C and a peripheral circuit region P. An isolation layer 83 may be disposed in the substrate 81. The isolation layer 83 may be an insulating layer, such as a silicon oxide layer. Gate patterns 90 may be disposed on the substrate 81 in the cell region C. Each of the gate patterns 90 may include a gate dielectric layer 86, a gate electrode 87, a hard mask 88, and a spacer 89. The gate electrode 87 and the hard mask 88 may be sequentially stacked on the substrate 81. The gate dielectric layer 86 may be interposed between the gate electrode 87 and the substrate 81. The spacer 89 may be disposed on sidewalls of the gate electrode 87 and the hard mask 88. Source and drain regions 85 may be disposed in the substrate 81 on both sides of the gate pattern 90. Landing pads 91 and 92 may be disposed on the source and drain regions 85. The landing pads 91 and 92 may include a bit line landing pad 91 and a storage landing pad 92. A lower interlayer dielectric layer 93 may be disposed on the substrate 81 having the gate patterns 90 and the landing pads 91 and 92. The lower interlayer dielectric layer 93 may be a silicon oxide layer, a silicon nitride layer, or a combination of two or more of the aforementioned layers.

The bit lines 97 may be disposed on the lower interlayer dielectric layer 93. A plurality of bit lines 97 may be disposed in each of the cell region C and the peripheral circuit region P. The bit lines 97 may be electrically connected to the bit line landing pad 91 by a bit line contact plug 95 that penetrates the lower interlayer dielectric layer 93. In other words, the bit line 97 may be electrically connected to the source/drain region 85 by the bit line contact plug 95 and the bit line landing pad 91. The bit line 97 may be formed of tungsten (W), polysilicon, or metal silicide.

The substrate 81 having the bit lines 97 is covered with a first interlayer dielectric layer 99. The first interlayer dielectric layer 99 may be an HDP oxide layer, a BPSG layer, a PE-TEOS layer, a silicon nitride layer, a silicon oxynitride layer, or a combination of one or more of the aforementioned layers.

A storage pad 103 and a first dummy pattern 104 are disposed on the first interlayer dielectric layer 99. The storage pad 103 and the first dummy pattern 104 may be formed of the same material. The storage pad 103 and the first dummy pattern 104 may be formed of a material having an etch selectivity with respect to the first interlayer dielectric layer 99. The storage pad 103 and the first dummy pattern 104 may be formed of one material selected from the group consisting of polysilicon, tungsten (W), aluminum (Al), and copper (Cu). The storage pad 103 may be disposed in the cell region C. The storage pad 103 may be electrically connected to the storage landing pad 92 by a buried contact plug 101 that penetrates the first interlayer dielectric layer 99 and the lower interlayer dielectric layer 93. That is, the storage pad 103 may be electrically connected to the source/drain region 85 by the buried contact plug 101 and the storage landing pad 92. The first dummy pattern 104 may be disposed in the peripheral circuit region P. The first dummy pattern 104 may partially overlap the bit line 97.

The substrate 81 having the storage pad 103 and the first dummy pattern 104 is covered with a second interlayer dielectric layer 105. The second interlayer dielectric layer 105 may be an HDP oxide layer, a BPSG layer, a PE-TEOS layer, a silicon nitride layer, a silicon oxynitride layer, or a combination of one or more of the aforementioned layers. For example, when the storage pad 103 is formed of polysilicon, the second interlayer dielectric layer 105 may be a silicon nitride layer.

A storage node 107 is disposed through the second interlayer dielectric layer 105 and comes into contact with the storage pad 103. A plate electrode 109 is disposed on the storage node 107. A capacitor dielectric layer 108 is interposed between the plate electrode 109 and the storage node 107. The storage node 107, the capacitor dielectric layer 108, and the plate electrode 109 may constitute a cell capacitor 110. The plate electrode 109 may cover the substrate 81 in the cell region C.

A second dummy pattern 114 is disposed on the second interlayer dielectric layer 105 in the peripheral circuit region P. The second dummy pattern 114 may partially overlap the bit line 97. Also, the second dummy pattern 114 may be spaced apart from the first dummy pattern 104 when viewed from a plan view. When viewed from a plan view, a distance between the first dummy pattern 104 and the second dummy pattern 114 may be less than the resolution limit of a photolithography process. A bottom surface of the second dummy pattern 114 may be disposed at a level that is higher than a bottom surface of the first dummy pattern 104. A portion of the capacitor dielectric layer 108 may remain between the second dummy pattern 114 and the second interlayer dielectric layer 105.

The second dummy pattern 114 and the plate electrode 109 may be formed of the same material. The second dummy pattern 114 and the plate electrode 109 may be formed of a material having an etch selectivity with respect to the second and first interlayer dielectric layers 105 and 99. The second dummy pattern 114 and the plate electrode 109 may be formed of one material selected from the group consisting of polysilicon, tungsten (W), aluminum (Al), and copper (Cu). The capacitor dielectric layer 108 may be a silicon oxide layer or a high-k dielectric layer.

The substrate 81 having the second dummy pattern 114 and the plate electrode 109 is covered with a third interlayer dielectric layer 115. The third interlayer dielectric layer 115 may be an HDP oxide layer, a BPSG layer, a PE-TEOS layer, a silicon nitride layer, a silicon oxynitride layer, or a combination of two or more of the aforementioned layers. The first and second dummy patterns 104 and 114 may be formed of a material having an etch selectivity with respect to the third, second, and first interlayer dielectric layers 115, 105, and 99.

A first contact hole 118 is disposed through the third, second, and first interlayer dielectric layers 115, 105, and 99 to expose the bit line 97 in the peripheral circuit region P. Also, a second contact hole 119 may be disposed through the third interlayer dielectric layer 115 to expose the plate electrode 109. When viewed from a plan view, the first contact hole 118 may have a square shape, a rectangular shape, a circular shape, or an elliptical shape. The first contact hole 118 is disposed between the first and second dummy patterns 104 and 114. That is, the first contact hole 118 may be self-aligned on the bit line 97 due to the first and second dummy patterns 104 and 114.

A first contact plug 123 may be disposed in the first contact hole 118. A second contact plug 133 may be disposed in the second contact hole 119. Each of the first and second contact plugs 123 and 133 may include a contact barrier metal layer 121 and a contact metal layer 122. The contact barrier metal layer 121 may be disposed to surround sidewalls and a bottom of the contact metal layer 122. In alternative embodiments, the contact barrier metal layer 121 may be omitted.

A first interconnection 127 and a second interconnection 137 may be disposed on the third interlayer dielectric layer 115. The first interconnection 127 may be in contact with the first contact plug 123. The second interconnection 137 may be in contact with the second contact plug 133. Each of the first and second interconnections 127 and 137 may include a barrier metal layer 125 and a metal layer 126, which are sequentially stacked. In alternative embodiments, the barrier metal layer 125 may be omitted.

Consequently, the first interconnection 127 may be electrically connected to the bit line 97 by the first contact plug 123 that sequentially penetrates the third, second, and first interlayer dielectric layers 115, 105, and 99. The first contact plug 123 is disposed between the first and second dummy patterns 104 and 114. In other words, the first contact plug 123 may be self-aligned on the bit line 97 due to the first and second dummy patterns 104 and 114. A contact surface between the first contact plug 123 and the bit line 97 may have a square shape, a rectangular shape, a circular shape, or an elliptical shape.

A method of fabricating the semiconductor device of FIG. 2 is described in the following paragraphs with reference to FIGS. 2 through 8.

Figure 3:
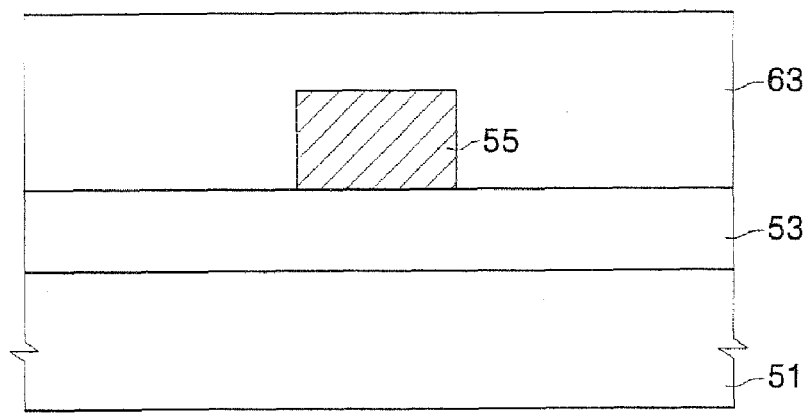
FIGS. 3 through 8 are cross-sectional diagrams taken along line I-I' of FIG. 2, illustrating a method of fabricating the semiconductor device of FIG. 2 according to some embodiments of the invention.

Referring to FIGS. 2 and 3, conductive patterns 55, 56, and 57 are formed on a substrate 51. The substrate 51 may be a semiconductor substrate, such as a silicon wafer or an SOI wafer. Normally, some components such as an isolation layer and an access transistor, may be formed on the substrate 51, but a detailed description thereof will not be presented here for brevity of explanation. A lower interlayer dielectric layer 53 may be formed on the substrate 51. The lower interlayer dielectric layer 53 may be a silicon oxide layer, a silicon nitride layer, or a combination thereof. The lower interlayer dielectric layer 53 may be formed to cover the substrate 51. The conductive patterns 55, 56, and 57 may be a first conductive pattern 55, a second conductive pattern 56, and a third conductive pattern 57, which are spaced apart from one another. The conductive patterns 55, 56, and 57 may be formed on the lower interlayer dielectric layer 53. The conductive patterns 55, 56, and 57 may be formed of a polysilicon layer, a tungsten (W) layer, or a metal silicide layer. Alternatively, the conductive patterns 55, 56, and 57 may be formed in the substrate 51. In this case, the conductive patterns 55, 56, and 57 may be impurity-doped active regions. Also, the lower interlayer dielectric layer 53 may be omitted.

A first interlayer dielectric layer 63 may be formed on the substrate 51 having the conductive patterns 55, 56, and 57. The first interlayer dielectric layer 63 may be an HDP oxide layer, a BPSG layer, a PE-TEOS layer, a silicon nitride layer, a silicon oxynitride layer, or a combination of two or more of the aforementioned layers. Thereafter, a top surface of the first interlayer dielectric layer 63 may be planarized by a chemical mechanical polishing (CMP) process or an etch-back process.

Figure 4:
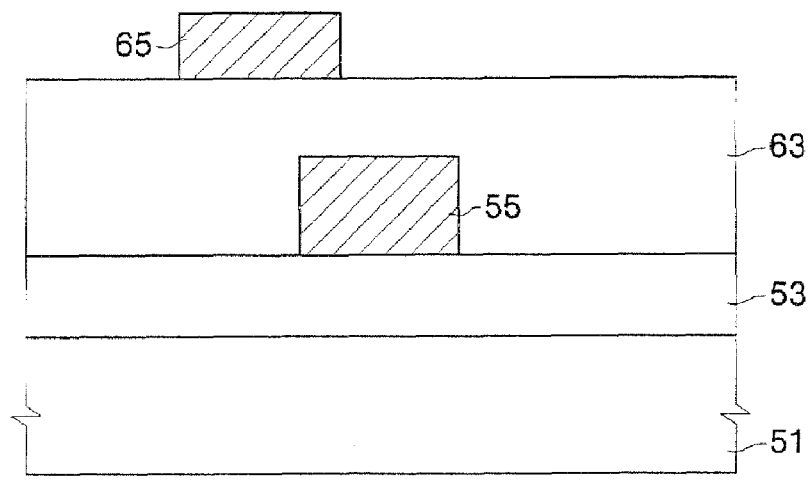

Referring to FIGS. 2 and 4, first dummy patterns 65 are formed on the first interlayer dielectric layer 63. The formation of the first dummy patterns 65 may include forming a first dummy layer (not shown) on the first interlayer dielectric layer 63 and patterning the first dummy layer. The first dummy patterns 65 may partially overlap the conductive patterns 55, 56, and 57. The first dummy patterns 65 may be formed of a material having an etch selectivity with respect to the first interlayer dielectric layer 63. The first dummy patterns 65 may be formed of one material selected from the group consisting of polysilicon, tungsten (W), aluminum (Al), and copper (Cu).

Figure 5:
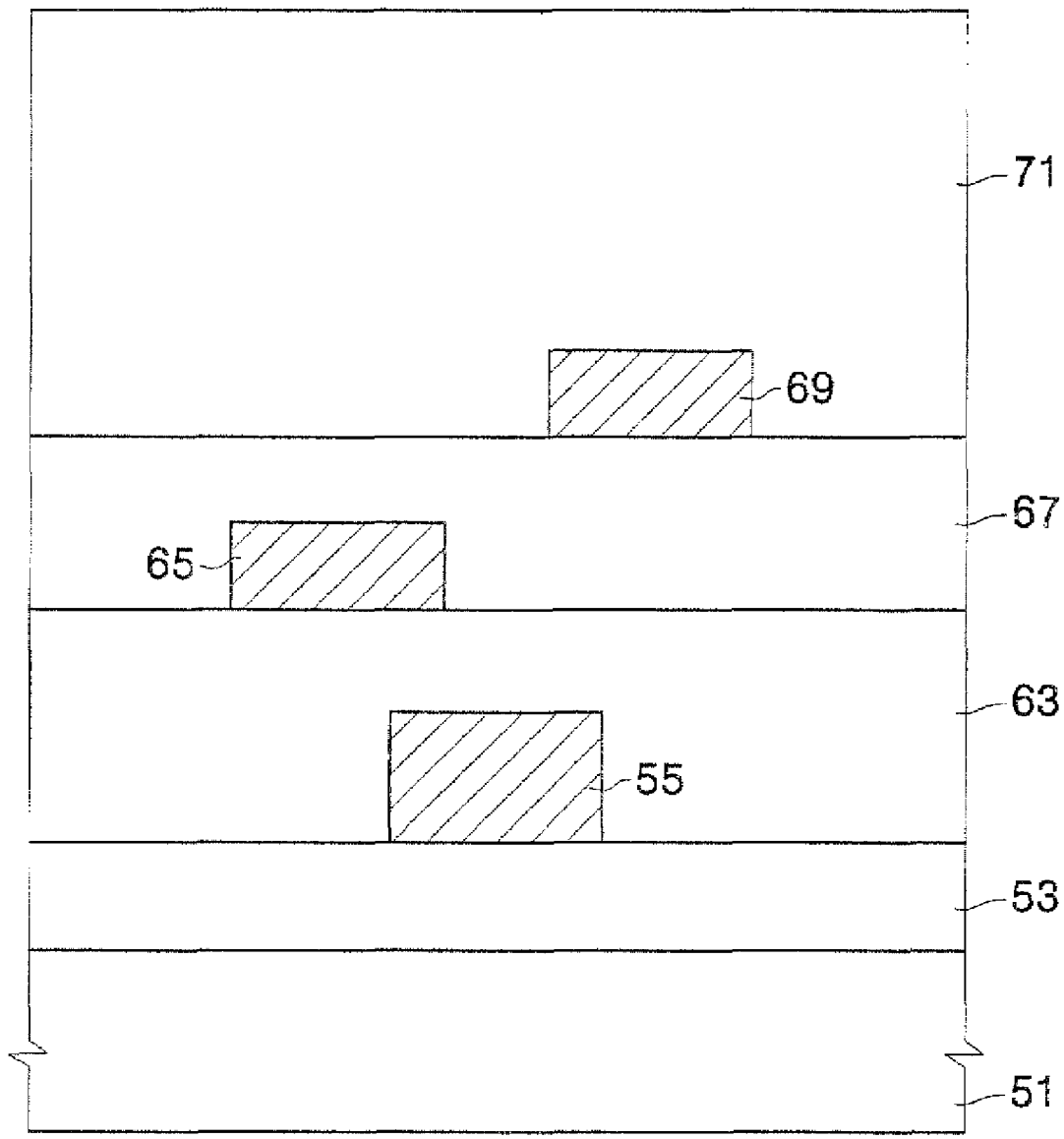

Referring to FIGS. 2 and 5, a second interlayer dielectric layer 67 is formed on the substrate 51 having the first dummy patterns 65. The second interlayer dielectric layer 67 may be an HDP oxide layer, a BPSG layer, a PE-TEOS layer, a silicon nitride layer, a silicon oxynitride layer, or a combination of two or more of the aforementioned layers. Thereafter, a top surface of the second interlayer dielectric layer 67 may be planarized by a CMP process or an etch-back process.

Second dummy patterns 69 are formed on the second interlayer dielectric layer 67. The formation of the second dummy patterns 69 may include forming a second dummy layer (not shown) on the second interlayer dielectric layer 67 and patterning the second dummy layer. The second dummy patterns 69 may be spaced apart from the first dummy patterns 65 and partially overlap the first conductive patterns 55, 56, and 57. The second dummy patterns 69 may be formed of a material having an etch selectivity with respect to the first and second interlayer dielectric layers 63 and 67. The second dummy patterns 69 may be formed of one material selected from the group consisting of polysilicon, tungsten (W), aluminum (Al), and copper (Cu).

A third interlayer dielectric layer 71 is formed on the substrate 51 having the second dummy patterns 69. The third interlayer dielectric layer 71 may be an HDP oxide layer, a BPSG layer, a PE-TEOS layer, a silicon nitride layer, a silicon oxynitride layer, or a combination of two or more of the aforementioned layers. Thereafter, a top surface of the third interlayer dielectric layer 71 may be planarized by a CMP process or an etch-back process.

Figure 6:
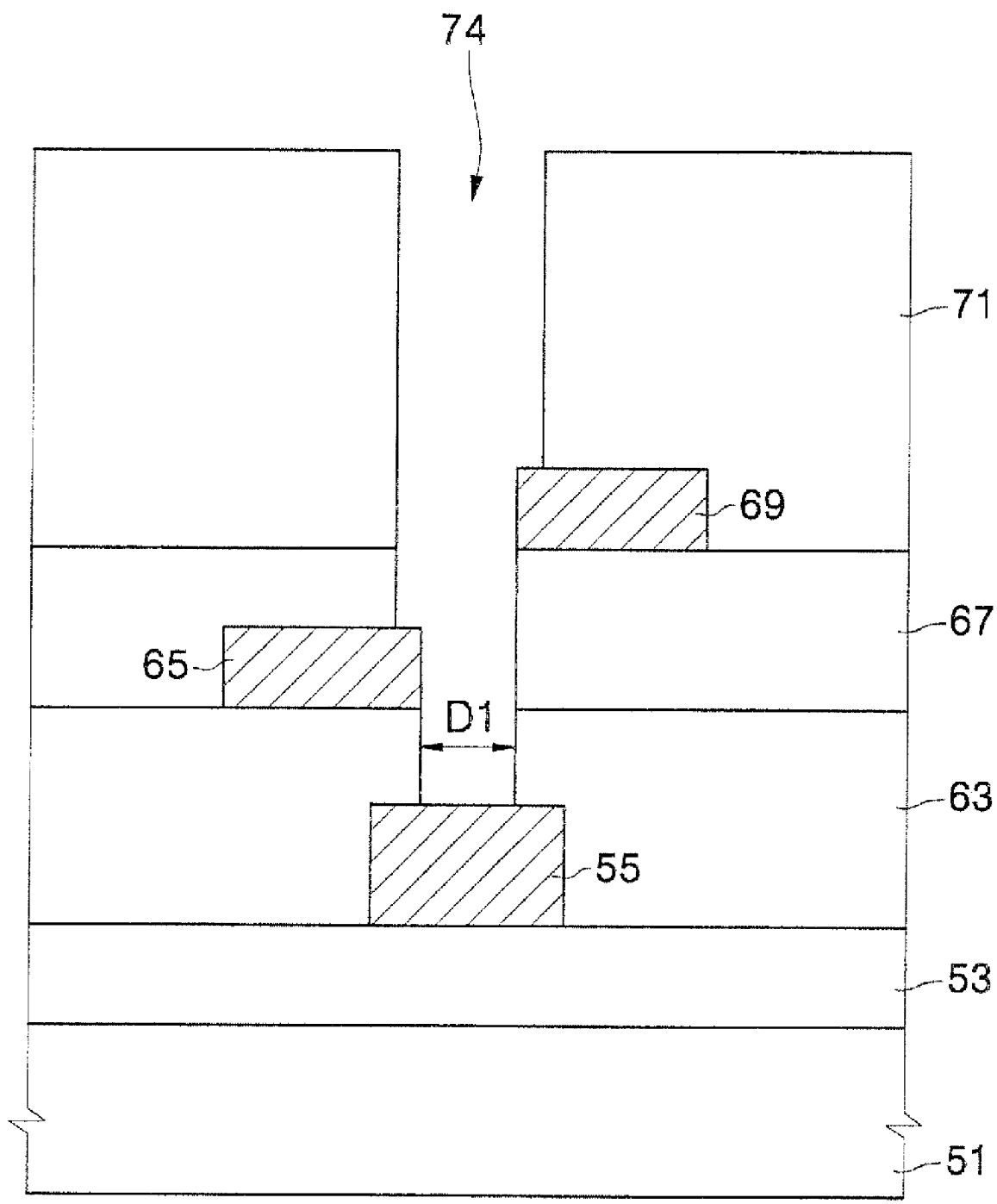

Referring to FIGS. 2 and 6, a first contact hole 74 is formed by a patterning process to expose the first conductive pattern 55 through the third, second, and first interlayer dielectric layers 71, 67, and 63. Also, the first contact hole 74 and a second contact hole 75 adjacent to the first contact hole 74 may be formed on the second conductive pattern 56. Furthermore, a third contact hole 76 may be formed on the third conductive pattern 57.

The patterning process for forming the first, second, and third contact holes 74, 75, and 76 may include forming a mask pattern (not shown), such as a photoresist pattern, on the third interlayer dielectric layer 71 and sequentially and anisotropically etching the third, second, and first interlayer dielectric layers 71, 67, and 63 using the mask pattern as an etch mask. The first dummy patterns 65 may be formed of a material having an etch selectivity with respect to the second and first interlayer dielectric layers 67 and 63. Also, the second dummy patterns 69 may be formed of a material having an etch selectivity with respect to the third, second, and first interlayer dielectric layers 71, 67, and 63. In this case, the second dummy patterns 69 and the first dummy patterns 65 may function as etch stop layers. Thus, the first, second, and third contact holes 74, 75, and 76 may be formed between the first dummy patterns 65 and the second dummy patterns 69, which face each other. That is, the first, second, and third contact holes 74, 75, and 76 may be self-aligned on the conductive patterns 55, 56, and 57 due to the first dummy patterns 65 and the second dummy patterns 69. As a result, a sufficient alignment margin can be ensured in the patterning process. When viewed from a plan view, a distance D1 between the first dummy pattern 65 and the second dummy pattern 69 may be less than the resolution limit of a photolithography process. Each of the contact holes 74, 75, and 76 may form a square, a rectangle, a circle, or an ellipse when viewed from a plan view.

Figure 7:
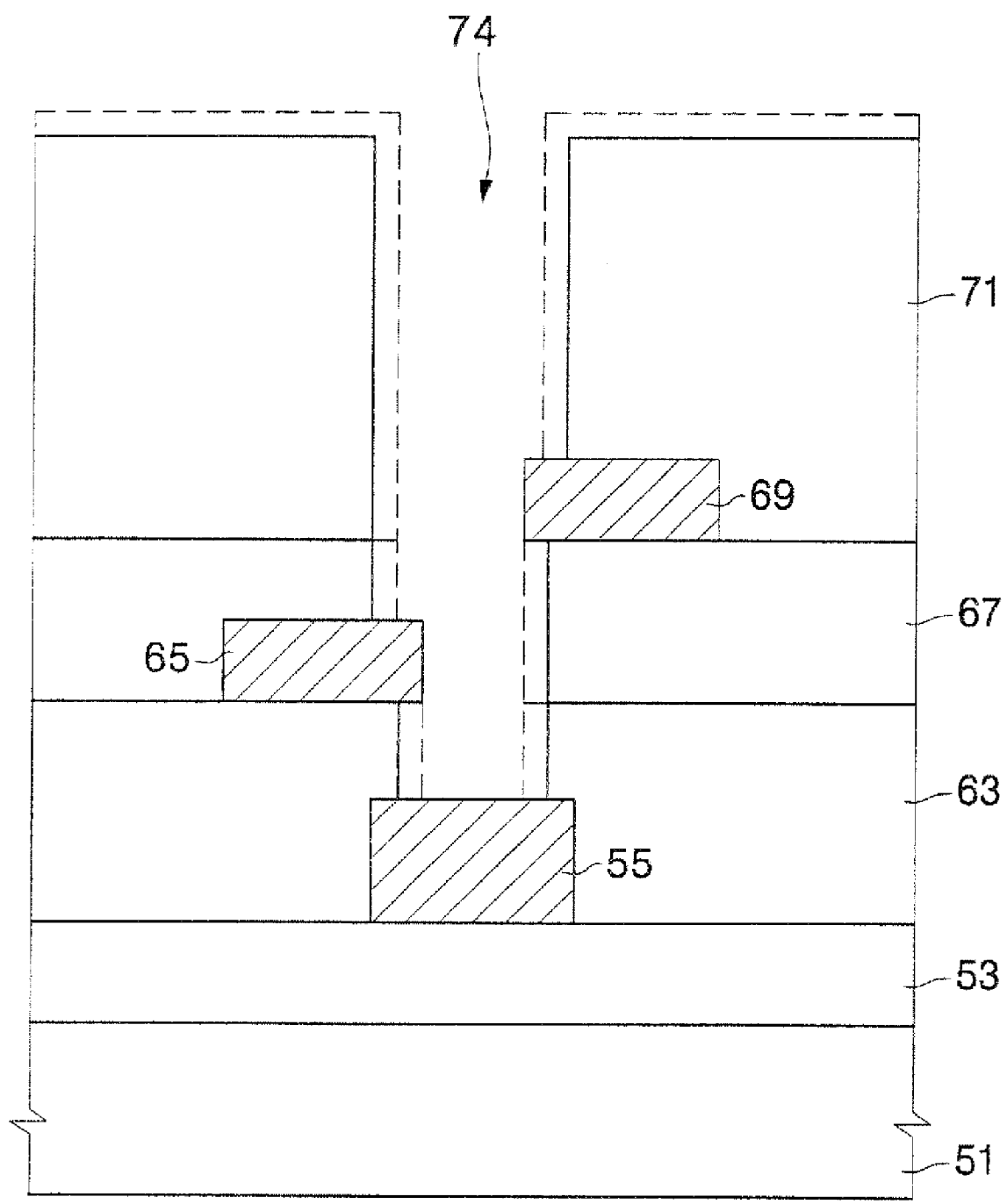

Referring to FIGS. 2 and 7, the contact holes 74, 75, and 76 may expand using an isotropic etching process. The isotropic etching process may be performed under process conditions having a high etch selectivity with respect to the second and first interlayer dielectric layers 67 and 63. As a result, top surfaces of the conductive patterns 55, 56, and 57 exposed by the contact holes 74, 75, and 76 can be extended. In alternative embodiments, the isotropic etching process may be omitted.

Referring to FIGS. 2 and 8, contact plugs 78 may be formed in the first, second, and third contact holes 74, 75, and 76. The formation of the contact plugs 78 may include forming a contact conductive layer to fill the contact holes 74, 75, and 76 and to cover the third interlayer dielectric layer 71 and then planarizing the contact conductive layer. The planarization of the contact conductive layer may be performed by a CMP process using the third interlayer dielectric layer 71 as a stop layer.

The contact plugs 78 may be formed through the third, second, and first interlayer dielectric layers 71, 67, and 63 and brought into contact with the first, second, and third conductive patterns 55, 56, and 57. Also, the contact plugs 78 may be disposed between the first dummy patterns 65 and the second dummy patterns 69, which face each other. That is, the contact plugs 78 may be self-aligned on the conductive patterns 55, 56, and 57 due to the first dummy patterns 65 and the second dummy patterns 69. Contact surfaces between the contact plugs 78 and the conductive patterns 55, 56, and 57 may have a square shape, a rectangular shape, a circular shape, or an elliptical shape.

A method of fabricating a DRAM according to some other embodiments of the invention will be described in the following paragraphs with reference to FIGS. 9 through 13.

Figure 9:
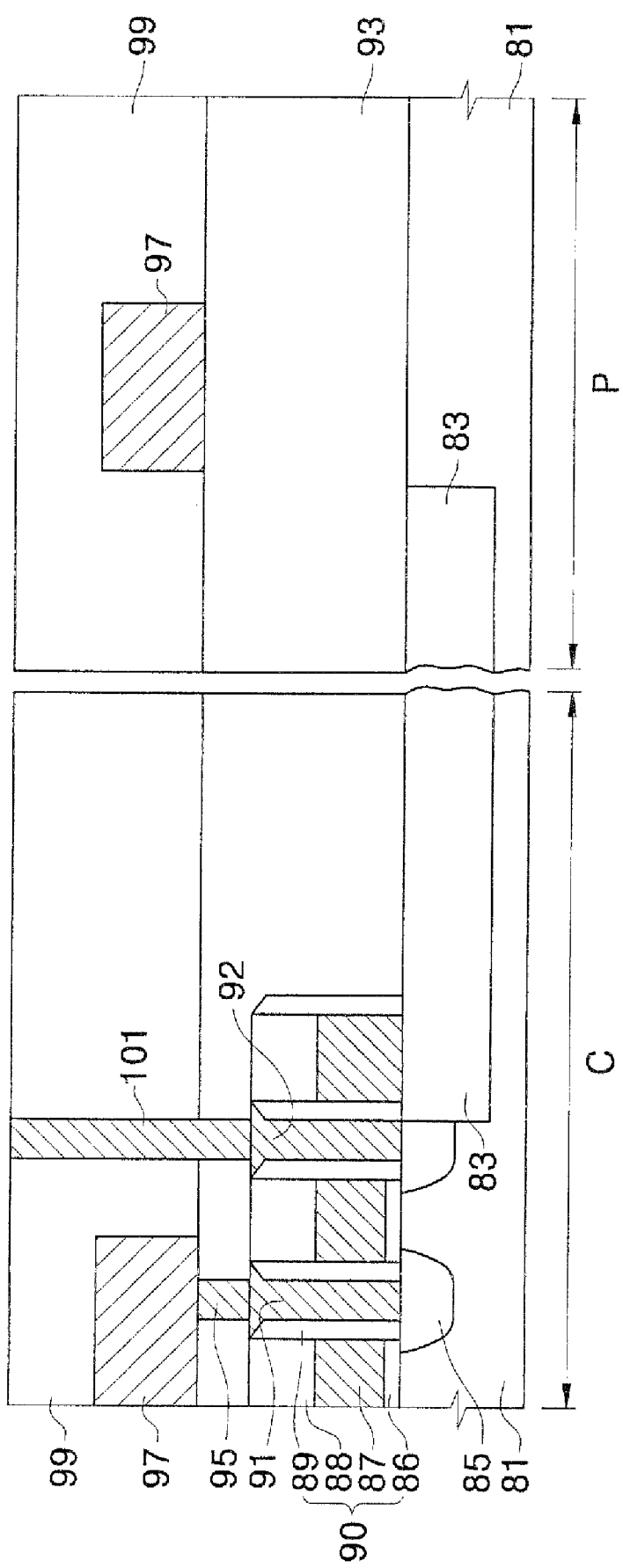
FIGS. 9 through 13 are cross-sectional diagrams illustrating a method of fabricating a dynamic random access memory (DRAM) device having a self-aligned contact according to some embodiments of the invention.

Referring to FIG. 9, a substrate 81 having a cell region C and a peripheral circuit region P is prepared. The substrate 81 may be a semiconductor substrate, such as a silicon wafer or an SOI wafer. An isolation layer 83 may be formed in the substrate 81. The isolation layer 83 may be an insulating layer, such as a silicon oxide layer. Gate patterns 90 may be formed on the substrate 81 in the cell region C. Each of the gate patterns 90 may include a gate dielectric layer 86, a gate electrode 87, a hard mask 88, and a spacer 89. The gate dielectric layer 86, the gate electrode 87, and the hard mask 88 may be sequentially stacked on the substrate 81. The spacer 89 may be formed on sidewalls of the gate electrode 87 and the hard mask 88. Source and drain regions 85 may be formed in the substrate 81 on both sides of the gate pattern 90. Landing pads 91 and 92 may be formed on the source and drain regions 85. The landing pads 91 and 92 may include a bit line landing pad 91 and a storage landing pad 92. A lower interlayer dielectric layer 93 may be formed on the substrate 81 having the gate patterns 90 and the landing pads 91 and 92. The lower interlayer dielectric layer 93 may be a silicon oxide layer, a silicon nitride layer, or a combination of two or more of the aforementioned layers.

A bit line contact plug 95 may be formed in the lower interlayer dielectric layer 93 and brought into contact with the bit line landing pad 91. Bit lines 97 may be formed on the lower interlayer dielectric layer 93. A plurality of bit lines 97 may be formed in each of the cell region C and the peripheral circuit region P. The bit lines 97 may be in contact with the bit line contact plug 95. The bit lines 97 may be electrically connected to the bit line landing pad 91 by the bit line contact plug 95. In other words, the bit line 97 may be electrically connected to the source/drain region 85 by the bit line contact plug 95 and the bit line landing pad 91. The bit line 97 may be formed of tungsten (W), polysilicon, or metal silicide.

A first interlayer dielectric layer 99 may be formed on the substrate 81 having the bit lines 97. The first interlayer dielectric layer 99 may be an HDP oxide layer, a BPSG layer, a PE-TEOS layer, a silicon nitride layer, a silicon oxynitride layer, or a combination of two or more of the aforementioned layers.

A buried contact plug 101 may be formed through the first interlayer dielectric layer 99 and the lower interlayer dielectric layer 93 and brought into contact with the storage landing pad 92.

Figure 10:
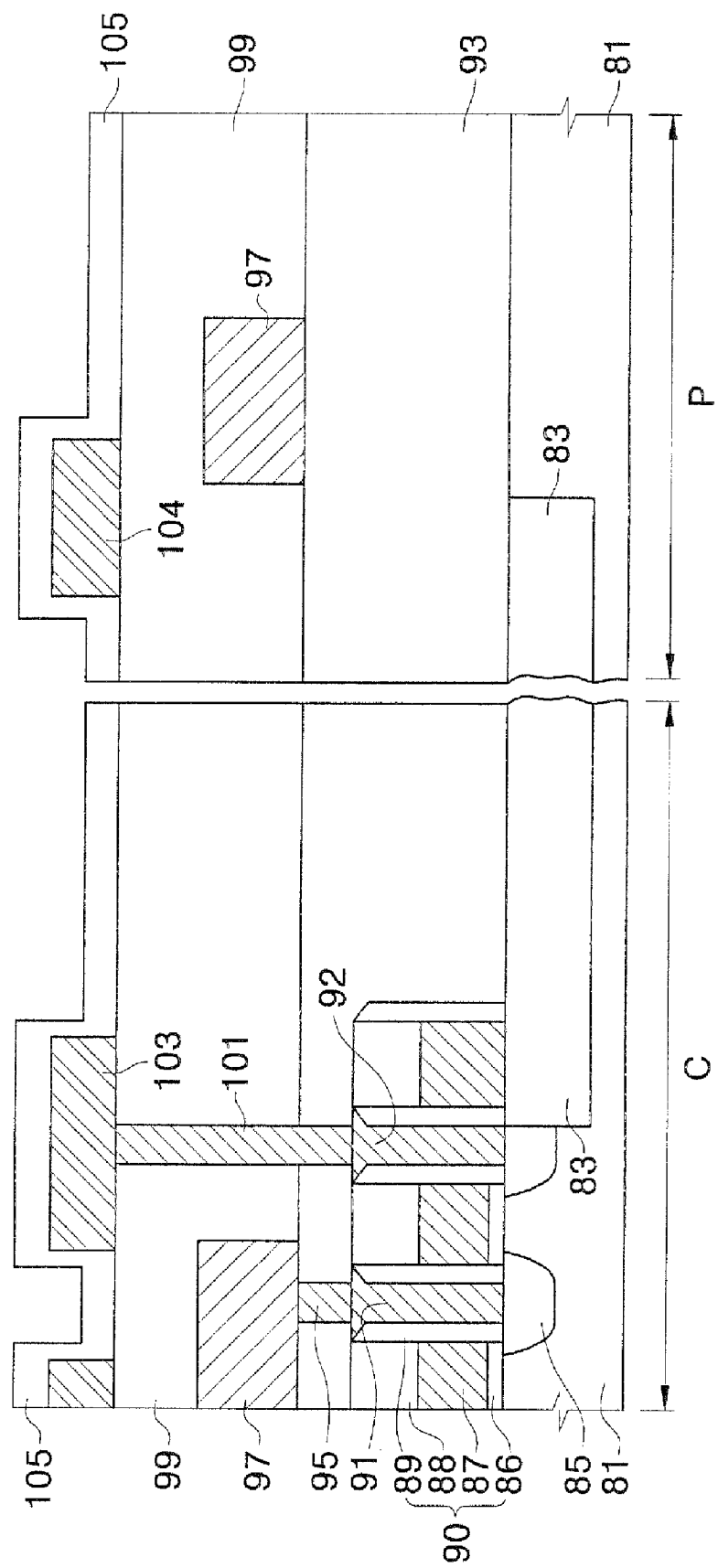

Referring to FIG. 10, a storage pad 103 and a first dummy pattern 104 are formed on the first interlayer dielectric layer 99.

Specifically, a first conductive layer may be formed on the first interlayer dielectric layer 99. The first conductive layer may be formed of a material having an etch selectivity with respect to the first interlayer dielectric layer 99. The first conductive layer may be formed of one material selected from the group consisting of polysilicon, tungsten (W), aluminum (Al), and copper (Cu). The first conductive layer may be patterned to simultaneously form the storage pad 103 on the buried contact plug 101 and the first dummy pattern 104 in the peripheral circuit region P.

As a result, the storage pad 103 and the first dummy pattern 104 may be formed of the same material. The storage pad 103 and the first dummy pattern 104 may be formed of a material having an etch selectivity with respect to the first interlayer dielectric layer 99. The storage pad 103 and the first dummy pattern 104 may be formed of one material selected from the group consisting of polysilicon, tungsten (W), aluminum (Al), and copper (Cu). The storage pad 103 may be electrically connected to the storage landing pad 92 by the buried contact plug 101 that penetrates the first interlayer dielectric layer 99 and the lower interlayer dielectric layer 93. That is, the storage pad 103 may be electrically connected to the source/drain region 85 by the buried contact plug 101 and the storage landing pad 92. The first dummy pattern 104 may be formed in the peripheral circuit region P. Here, the first dummy pattern 104 may partially overlap the bit line 97.

A second interlayer dielectric layer 105 may be formed on the substrate 81 having the storage pad 103 and the first dummy pattern 104. The second interlayer dielectric layer 105 may be formed of a material having an etch selectivity with respect to the storage pad 103 and the first dummy pattern 104. The second interlayer dielectric layer 105 may be an HDP oxide layer, a BPSG layer, a PE-TEOS layer, a silicon nitride layer, a silicon oxynitride layer, or a combination of two or more of the aforementioned layers. For example, when the storage pad 103 and the first dummy pattern 104 are formed of polysilicon, the second interlayer dielectric layer 105 may be a silicon nitride layer.

Figure 11:
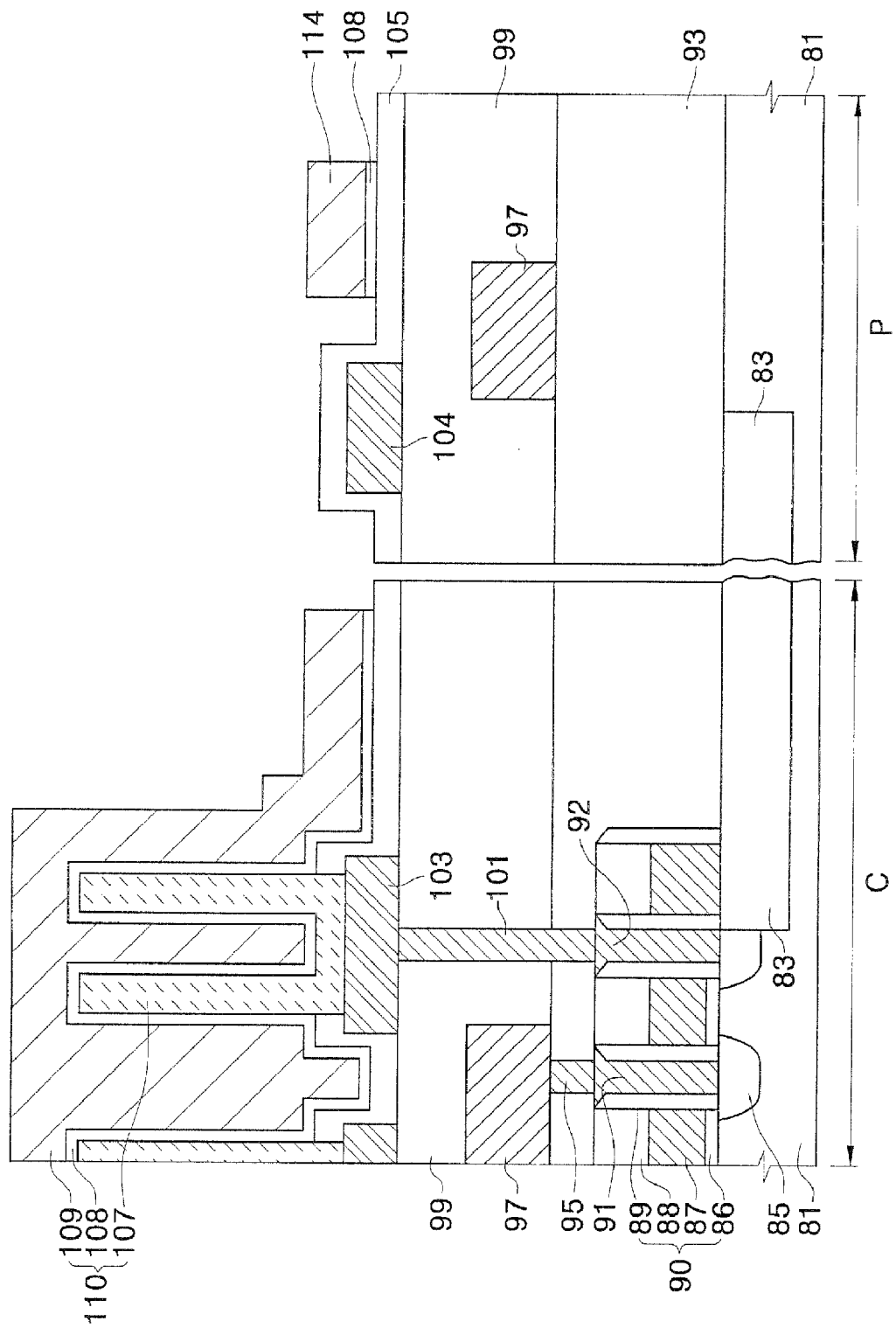

Referring to FIG. 11, a storage node 107 may be formed through the second interlayer dielectric layer 105 and brought into contact with the storage pad 103. The storage node 107 may be formed of a conductive material, such as polysilicon. A capacitor dielectric layer 108 may be formed on the substrate 81 having the storage node 107. The capacitor dielectric layer 108 may be a silicon oxide layer or a high-k dielectric layer.

A second conductive layer may be formed on the substrate 81 having the capacitor dielectric layer 108. The second conductive layer may be formed of a material having an etch selectivity with respect to the second and first interlayer dielectric layers 105 and 99. The second conductive layer may be formed of one material selected from the group consisting of polysilicon, tungsten (W), aluminum (Al), and copper (Cu). The second conductive layer may be patterned to form a plate electrode 109 in the cell region C and to simultaneously form a second dummy pattern 114 in the peripheral circuit region P. The plate electrode 109 may be formed to cover the substrate 81 in the cell region C.

While patterning the second conductive layer, the capacitor dielectric layer 108 may also be patterned. In this case, a portion of the capacitor dielectric layer 108 may remain between the plate electrode 109 and the storage node 107. The storage node 107, the capacitor dielectric layer 108, and the plate electrode 109 may constitute a cell capacitor 110. Also, another portion of the capacitor dielectric layer 108 may remain between the second dummy pattern 114 and the second interlayer dielectric layer 105.

As a result, the second dummy pattern 114 and the plate electrode 109 may be formed of the same material. The second dummy pattern 114 and the plate electrode 109 may be formed of a material having an etch selectivity with respect to the second and first interlayer dielectric layers 105 and 99. The second dummy pattern 114 and the plate electrode 109 may be formed of one material selected from the group consisting of polysilicon, tungsten (W), aluminum (Al), and copper (Cu).

The second dummy pattern 114 may partially overlap the bit line 97. Also, the second dummy pattern 114 may be spaced apart from the first dummy pattern 104 when viewed from a plan view. A distance between the first dummy pattern 104 and the second dummy pattern 114 may be less than the resolution limit of a photolithography process when viewed from a plan view. A bottom surface of the second dummy pattern 114 may be on a higher level than a bottom surface of the first dummy pattern 104.

Figure 12:
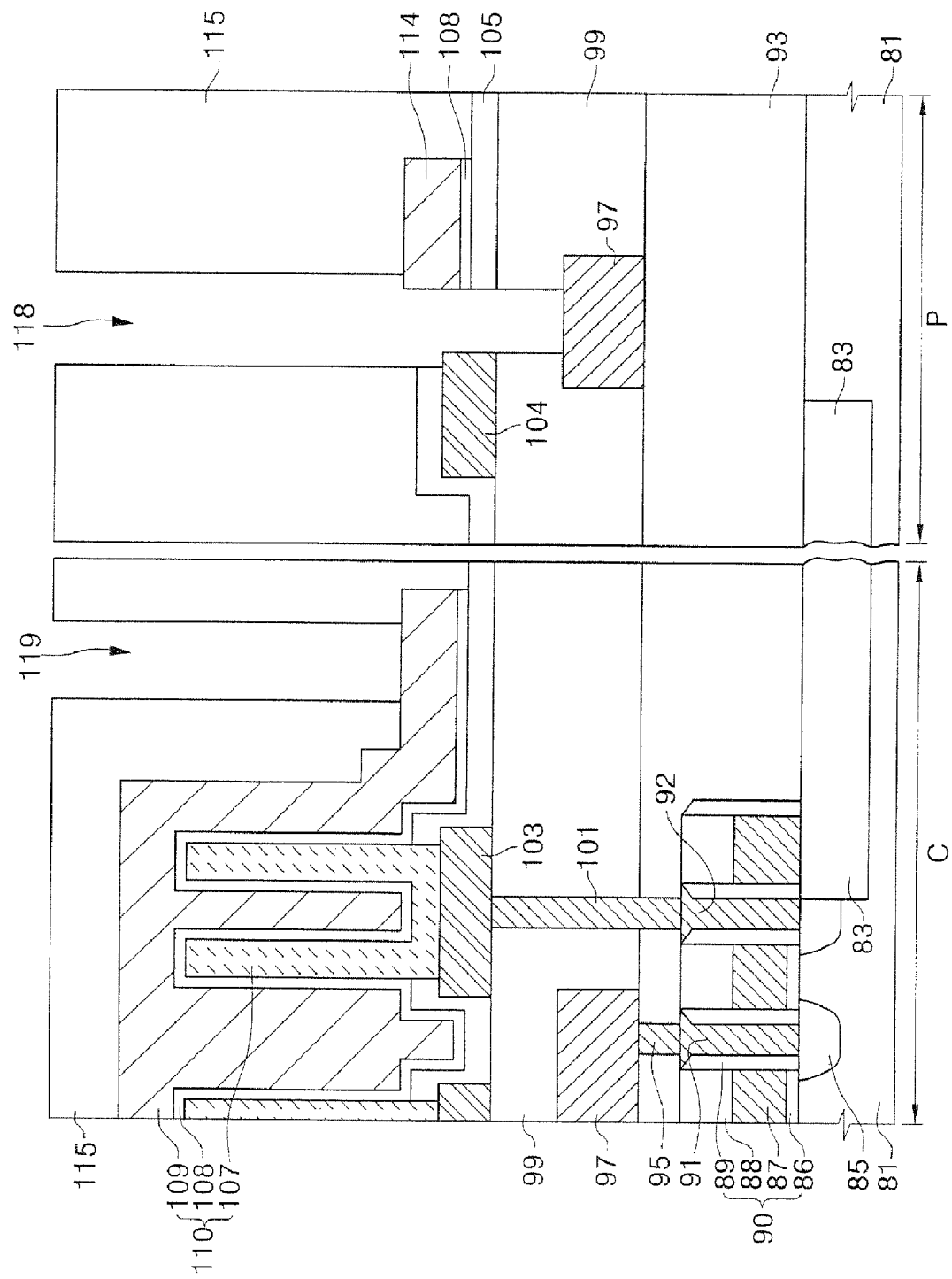

Referring to FIG. 12, a third interlayer dielectric layer 115 is formed on the substrate 81 having the second dummy pattern 114 and the plate electrode 109. The third interlayer dielectric layer 115 may be an HDP oxide layer, a BPSG layer, a PE-TEOS layer, a silicon nitride layer, a silicon oxynitride layer, or a combination of two or more of the aforementioned layers. The third interlayer dielectric layer 115 may be formed of a material having an etch selectivity with respect to the second dummy pattern 114 and the plate electrode 109. Thereafter, a top surface of the third interlayer dielectric layer 115 may be planarized by a chemical mechanical polishing (CMP) process or an etch-back process. As a result, the first and second dummy patterns 104 and 114 may be formed of a material having an etch selectivity with respect to the third, second, and first interlayer dielectric layers 115, 105, and 99.

A first contact hole 118 and a second contact hole 119 are formed by a patterning process. The patterning process may include forming a mask pattern (not shown), such as a photoresist pattern, on the third interlayer dielectric layer 115 and sequentially and anisotropically etching the third, second, and first interlayer dielectric layers 115, 105, and 99 using the mask pattern as an etch mask. In this case, the first dummy pattern 104, the second dummy pattern 114, and the plate electrode 109 may function as etch stop layers. Thus, the first contact hole 118 may be formed through the third, second, and first interlayer dielectric layers 115, 105, and 99 to expose the bit line 97 in the peripheral circuit region P. Also, the second contact hole 119 may be formed in the cell region C through the third interlayer dielectric layer 115 to expose the plate electrode 109.

The first contact hole 118 may be formed between the first and second dummy patterns 104 and 114. That is, the first contact hole 118 may be self-aligned on the bit line 97 due to the first and second dummy patterns 104 and 114. As a result, a sufficient alignment margin can be ensured in the patterning process. When viewed from a plan view, the first contact hole 118 may have the shape of a square, a rectangle, a circle, or an ellipse.

Referring to FIG. 13 again, a first contact plug 123 is formed in the first contact hole 118. Simultaneously, a second contact plug 133 may be formed in the second contact hole 119.

Specifically, a contact barrier metal layer 121 may be formed on inner walls of the first and second contact holes 118 and 119. A contact metal layer 122 may be formed to completely fill the first and second contact holes 118 and 119. The contact barrier metal layer 121 and the contact metal layer 122 may also be stacked on the third interlayer dielectric layer 115. Thereafter, the contact metal layer 122 and the contact barrier metal layer 121 may be planarized to form the first contact plug 123 and the second contact plug 133. The planarization of the contact metal layer 122 and the contact barrier metal layer 121 may be performed by a CMP process using the third interlayer dielectric layer 115 as a stop layer. The contact barrier metal layer 121 may be formed of titanium nitride (TiN). The contact metal layer 122 may be formed of tungsten (W). According to some embodiments, the planarization of the contact metal layer 122 and the contact barrier metal layer 121 may be performed by an etch-back process. In alternative embodiments, the contact barrier metal layer 121 may be omitted.

A barrier metal layer 125 and a metal layer 126 may be sequentially deposited on the substrate 81 having the first contact plug 123 and the second contact plug 133. The barrier metal layer 125 may be formed of titanium nitride (TiN). The metal layer 126 may be formed of tungsten (W). The barrier metal layer 125 and the metal layer 126 may be patterned to form a first interconnection 127 and a second interconnection 137 on the third interlayer dielectric layer 115. The first interconnection 127 may be in contact with the first contact plug 123. Also, the second interconnection 137 may be in contact with the second contact plug 133. However, the barrier metal layer 125 may be omitted.

Consequently, the first interconnection 127 may be electrically connected to the bit line 97 by the first contact plug 123 that sequentially penetrates the third, second, and first interlayer dielectric layers 115, 105, and 99. The first contact plug 123 is formed between the first and second dummy patterns 104 and 114. In other words, the first contact plug 123 may be self-aligned on the bit line 97 due to the first and second dummy patterns 104 and 114. A contact surface between the first contact plug 123 and the bit line 97 may form a square, a rectangle, a circle, or an ellipse.

According to the embodiments of the invention that were described above, a conductive pattern, a first dummy pattern, a second dummy pattern, and a contact plug are provided. The first dummy pattern partially overlaps the conductive pattern. The second dummy pattern is on a higher level than the first dummy pattern and partially overlaps the conductive pattern. The contact plug is disposed through an interlayer dielectric layer interposed between the first and second dummy patterns and comes into contact with the conductive pattern. The first and second dummy patterns function as etch stop layers while forming the contact plug. That is, a sufficient alignment margin can be ensured in a pattering process. Thus, the contact plug can be self-aligned on the conductive pattern. As a result, a semiconductor device having a self-aligned contact can be obtained.

The invention may be practiced in many ways. What follows are exemplary, non-limiting descriptions of some embodiments of the invention.

According to some embodiments, a semiconductor device includes a self-aligned contact and a conductive pattern disposed on a substrate. The substrate having the conductive pattern is covered with a first interlayer dielectric layer. A first dummy pattern is disposed on the first interlayer dielectric layer. The first dummy pattern partially overlaps the conductive pattern. The substrate having the first dummy pattern is covered with a second interlayer dielectric layer. A second dummy pattern is disposed on the second interlayer dielectric layer. The second dummy pattern partially overlaps the conductive pattern. The substrate having the second dummy pattern is covered with a third interlayer dielectric layer. A contact plug is in contact with the conductive pattern through the third interlayer dielectric layer, the second interlayer dielectric layer, and the first interlayer dielectric layer. The contact plug is disposed between the first dummy pattern and the second dummy pattern.

According to some embodiments, the first dummy pattern and the second dummy pattern may be formed of materials having an etch selectivity with respect to the first interlayer dielectric layer, the second interlayer dielectric layer, and the third interlayer dielectric layer. The first dummy pattern may be formed of one material selected from the group consisting of polysilicon, tungsten (W), aluminum (Al), and copper (Cu). The second dummy pattern may also be formed of one material selected from the group consisting of polysilicon, tungsten, aluminum, and copper.

According to some embodiments, the shortest distance between the first dummy pattern and the second dummy pattern may be less than the resolution limit of a photolithography process.

According to some embodiments, a dynamic random access memory (DRAM) includes a self-aligned contact and a bit line disposed on a substrate. The substrate having the bit line is covered with a first interlayer dielectric layer. A storage pad is disposed on the first interlayer dielectric layer. The storage pad is electrically connected to the substrate. A first dummy pattern is disposed on the first interlayer dielectric layer. The first dummy pattern partially overlaps the bit line. The substrate having the storage pad and the first dummy pattern is covered with a second interlayer dielectric layer. A storage node is disposed through the second interlayer dielectric layer and comes into contact with the storage pad. A plate electrode covers the storage node. A second dummy pattern is disposed on the second interlayer dielectric layer. The second dummy pattern partially overlaps the bit line. The substrate having the plate electrode and the second dummy pattern is covered with a third interlayer dielectric layer. A contact plug is in contact with the bit line through the third interlayer dielectric layer, the second interlayer dielectric layer, and the first interlayer dielectric layer. The contact plug is disposed between the first dummy pattern and the second dummy pattern.

According to some embodiments, the storage pad and the first dummy pattern may be formed of the same material. According to some embodiments, the plate electrode and the second dummy pattern may be formed of the same material.

According to some embodiments of the invention, a method of fabricating a semiconductor device having a self-aligned contact includes forming a conductive pattern on a substrate. A first interlayer dielectric layer is formed on the substrate having the conductive pattern. A first dummy pattern is formed on the first interlayer dielectric layer. The first dummy pattern partially overlaps the conductive pattern. A second interlayer dielectric layer is formed on the substrate having the first dummy pattern. A second dummy pattern is formed on the second interlayer dielectric layer. The second dummy pattern partially overlaps the conductive pattern. A third interlayer dielectric layer is formed on the substrate having the second dummy pattern. A contact plug is formed through the third interlayer dielectric layer, the second interlayer dielectric layer, and the first interlayer dielectric layer and brought into contact with the conductive pattern. The contact plug is formed between the first dummy pattern and the second dummy pattern.

Exemplary embodiments of the invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims. The inventors regard the subject matter of the invention to include all combinations and sub-combinations of the various elements, features, functions and/or properties disclosed herein.

The invention claimed is:

1. A semiconductor device comprising:
a conductive pattern disposed on a substrate;
a first interlayer dielectric layer disposed on the substrate and the conductive pattern;
a first dummy pattern disposed on the first interlayer dielectric layer and partially overlapping the conductive pattern;
a second interlayer dielectric layer disposed on the first interlayer dielectric layer and the first dummy pattern;
a second dummy pattern disposed on the second interlayer dielectric layer and partially overlapping the conductive pattern;
a third interlayer dielectric layer disposed on the second interlayer dielectric layer and the second dummy pattern; and
a contact plug that penetrates the third interlayer dielectric layer, the second interlayer dielectric layer, and the first interlayer dielectric layer to contact the conductive pattern, the contact plug arranged between the first dummy pattern and the second dummy pattern, the contact plug abutting the first dummy pattern and the second dummy pattern,
wherein a shortest distance between the first dummy pattern and the second dummy pattern is less than a resolution limit of a photolithography process.

2. A semiconductor device comprising:
a conductive pattern disposed on a substrate;
a first interlayer dielectric layer disposed on the substrate and the conductive pattern;
a first dummy pattern disposed on the first interlayer dielectric layer and partially overlapping the conductive pattern;
a second interlayer dielectric layer disposed on the first interlayer dielectric layer and the first dummy pattern;
a second dummy pattern disposed on the second interlayer dielectric layer and partially overlapping the conductive pattern;
a third interlayer dielectric layer disposed on the second interlayer dielectric layer and the second dummy pattern; and
a contact plug that penetrates the third interlayer dielectric layer, the second interlayer dielectric layer, and the first interlayer dielectric layer to contact the conductive pattern, the contact plug arranged between the first dummy pattern and the second dummy pattern, the contact plug abutting the first dummy Pattern and the second dummy pattern, wherein
the conductive pattern comprises a first sidewall, a second sidewall opposing the first sidewall, and an upper surface connecting the first sidewall and the second sidewall,
the first dummy pattern overlaps the first sidewall and a first portion of the upper surface of the conductive pattern extending from the first sidewall, and
the second dummy pattern overlaps the second sidewall and a second portion of the upper surface of the conductive pattern extending from the second sidewall.

3. The device of claim 2, wherein
the contact plug contacts the upper surface of the conductive pattern, and a width of the contact plug contacting the upper surface of the conductive pattern is substantially equal to a horizontal distance between the first dummy pattern and the second dummy pattern.

4. The device of claim 3, wherein
the contact plug contacts the upper surface of the conductive pattern, and
a width of the contact plug contacting the upper surface of the conductive pattern is greater than a horizontal distance between the first dummy pattern and the second dummy pattern.

5. A semiconductor device comprising:
a conductive pattern disposed on a substrate;
a first interlayer dielectric layer disposed on the substrate and the conductive pattern;
a first dummy pattern disposed on the first interlayer dielectric layer and partially overlapping the conductive pattern;
a second interlayer dielectric layer disposed on the first interlayer dielectric layer and the first dummy pattern;
a second dummy pattern disposed on the second interlayer dielectric layer and partially overlapping the conductive pattern;
a third interlayer dielectric layer disposed on the second interlayer dielectric layer and the second dummy pattern; and
a contact plug that penetrates the third interlayer dielectric layer, the second interlayer dielectric layer, and the first interlayer dielectric layer to contact the conductive pattern, the contact plug arranged between the first dummy Pattern and the second dummy pattern, the contact plug abutting the first dummy pattern and the second dummy pattern,
wherein the second dummy pattern does not overlap the first dummy pattern.

6. The device of claim 1, wherein the first dummy pattern and the second dummy pattern comprise a material having an etch selectivity with respect to the first interlayer dielectric layer, the second interlayer dielectric layer, and the third interlayer dielectric layer.

7. The device of claim 1, wherein the first dummy pattern is formed of a material selected from the group consisting of polysilicon, tungsten (W), aluminum (Al), and copper (Cu).

8. The device of claim 1, wherein the second dummy pattern is formed of a material selected from the group consisting of polysilicon, tungsten, aluminum, and copper.

9. The device of claim 2, wherein the first dummy pattern and the second dummy pattern comprise a material having an etch selectivity with respect to the first interlayer dielectric layer, the second interlayer dielectric layer, and the third interlayer dielectric layer.

10. The device of claim 2, wherein the first dummy pattern is formed of a material selected from the group consisting of polysilicon, tungsten (W), aluminum (Al), and copper (Cu).

11. The device of claim 2, wherein the second dummy pattern is formed of a material selected from the group consisting of polysilicon, tungsten, aluminum, and copper.

12. The device of claim 5, wherein the first dummy pattern and the second dummy pattern comprise a material having an etch selectivity with respect to the first interlayer dielectric layer, the second interlayer dielectric layer, and the third interlayer dielectric layer.

13. The device of claim 5, wherein the first dummy pattern is formed of a material selected from the group consisting of polysilicon, tungsten (W), aluminum (Al), and copper (Cu).

14. The device of claim 5, wherein the second dummy pattern is formed of a material selected from the group consisting of polysilicon, tungsten, aluminum, and copper.

* * * * *

UNITED STATES PATENT AND TRADEMARK OFFICE
CERTIFICATE OF CORRECTION

PATENT NO. : 7,564,135 B2  
APPLICATION NO. : 11/420203  
DATED : July 21, 2009  
INVENTOR(S) : Won-Mo Park Page 1 of 1

It is certified that error appears in the above-identified patent and that said Letters Patent is hereby corrected as shown below:

Column 4, line 61, the word "wafer," should read -- wafer. --;  
Column 14, line 53, the word "Pattern" should read -- pattern --;  
Column 15, line 5, the words "claim 3," should read -- claim 2, --;  
Column 15, line 31, the word "Pattern" should read -- pattern --.

Signed and Sealed this

Twentieth Day of October, 2009

David J. Kappos  
*Director of the United States Patent and Trademark Office*